United States Patent [19]
Kuge

[11] Patent Number: 5,818,772
[45] Date of Patent: Oct. 6, 1998

[54] SEMICONDUCTOR MEMORY DEVICES HAVING A BUILT-IN TEST FUNCTION

[75] Inventor: Shigehiro Kuge, Tokyo, Japan

[73] Assignee: Mitsubishi Denki Kabushiki Kaisha, Tokyo, Japan

[21] Appl. No.: 841,368

[22] Filed: Apr. 30, 1997

[30] Foreign Application Priority Data

Nov. 26, 1996 [JP] Japan ................................. 8-314699

[51] Int. Cl.$^6$ ..................................................... G06F 11/00
[52] U.S. Cl. ........................................... 365/201; 371/21.2
[58] Field of Search ................................ 365/201, 189.07; 371/21.2, 21.4, 21.6

[56] References Cited

U.S. PATENT DOCUMENTS 5,568,437  10/1996  Jamal ........................................ 365/201
5,661,729   8/1997  Miyazaki ................................... 365/201

*Primary Examiner*—Vu A. Le
*Attorney, Agent, or Firm*—McDermott, Will & Emery

[57] ABSTRACT

A built-in self-test circuit of semiconductor memory devices comprises a test clock generator that generates a clock for testing during the test of memory cells, a column address counter that gives column addresses, a first and second row-address counters that give row addresses, a data generator/comparator that generates test data and reads out the test data written in memory cells to compare with the test data, a timer that measures a predetermined time period, and a sequencer that controls these circuits wherein the BIST circuit write test data into memory cells in synchronization with the clock for testing, performs disturb for each of the memory cells and reads out the data written in the memory cells to compare the read data with the test data, thereby performing the self-test of the memory cells.

12 Claims, 16 Drawing Sheets

Fig.2A

→ Column

```
0 0 0 0 ······ 0 0
1 1 1 1 ······ 1 1
0 0 0 0 ······ 0 0

···

0 0 0 0 ······ 0 0
1 1 1 1 ······ 1 1
```
↓ Row (a) Positive pattern

Fig.2B

→ Column

```
1 1 1 1 ······ 1 1
0 0 0 0 ······ 0 0
1 1 1 1 ······ 1 1

···

1 1 1 1 ······ 1 1
0 0 0 0 ······ 0 0
```
↓ Row (b) Negative pattern

Fig.9A State transition of main sequencer

| Q1 | Q2 | State | State canceling signal |
|----|----|-------|------------------------|
| 0  | 0  | Wait  | ENTRY                  |
| 1  | 0  | Data write | ROW_END           |
| 1  | 1  | Disturb | DIS_END              |
| 0  | 1  | Comparison | ROW_END           |

Fig.9B State transition of subsequencer

| P1 | P2 | State | State canceling signal |
|----|----|-------|------------------------|
| 0  | 0  | Wait  | DIS                    |
| 1  | 0  | Write disturb | TIME_OUT       |
| 1  | 1  | Refresh | RF_END               |
| 0  | 1  | Address increment | Not available |

SEMICONDUCTOR MEMORY DEVICES HAVING A BUILT-IN TEST FUNCTION

BACKGROUND OF THE INVENTION

1. Field of the Invention

The present invention relates to design for facilitating the test of memory devices and more particularly to semiconductor memory with built-in test circuits within the chip based on BIST methods.

2. Description of the Related Art

As the scale of LSI circuits becomes greater, it takes extremely great time for the designers to create test patterns taking into consideration the functions and operations of the circuits. Error simulation requires a great amount of time, and the evaluation of the fault detection rate becomes difficult in practice. Further, the increase in the number of test vectors and the deduction of test cycles require high degrees of functions and performance of LSI circuit testers, incurring a rise in the cost of testing. In particular, in case of memory, the increase in test time accompanied with the increase of memory size in terms of the bit number has become a great problem. Consequently, design for facilitating LSI testing is currently indispensable.

There has been a built-in self-test (BIST) as a method of facilitating LSI circuit testing. A BIST has a means for generating test patterns and a means of evaluating test results within the LSI circuit and performs a self-test.

An example of BIST technology applied to LSI circuits is disclosed in "A BIST scheme using microprogram ROM for large capacity memories," H. Koike et al., *International test conference paper*, 36.1, pp. 815–822 (1990). FIG. 16 shows an example of BIST circuits using the microprogram ROM. FIG. 16 illustrates a configuration that allows $N^2$ pattern tests. Here, in an $N^2$ pattern test, the number of write/read tests is proportional to $N^2$, if the number of memory cells is N.

In $N^2$ pattern tests, a predetermined test pattern is first written into all the cells as test data. Next, one cell, called base cell hereafter, is specified in the memory, and the test data is read out from all the cells except the base cell. This procedure, called disturb hereafter, is performed so that the electric potential at the word line connected to the base cell is varied by reading out the data from all the cells except the base cell, and the effects on the base cell of the fluctuation of the electric potential at the word line are observed. After every cell is made a base cell repeating this disturb, the data written into all the cells are compared with the data read out therefrom to output the comparison results. Memory testing is conducted in this way by writing data and performing disturb for all the cells.

The semiconductor memory device of FIG. 16 is described in the following. The semiconductor memory device comprises an address buffer 11, a clock generator 13, a row decoder 15, a column decoder 17, memory cells 19, an I/O 21, and a BIST circuit 23.

Bist circuit 23 comprises a test-clock generator 25, a loop counter 27, a program counter 29, a microprogram ROM 31, an address counter 33, a base register 35, a switch 37, and a data generator/comparator 39. Test-clock generator 25 generates a clock during testing to provide to each circuit within BIST circuit 23. Loop counter 27 increments program counter 29 in synchronization with the clock generated by test-clock generator 25. Microprogram ROM 31 stores microcode to output a microprogram code word of the address specified by program counter 29. Address counter 33 generates the address of a memory cell to be processed following the microprogram code word output from microprogram ROM 31. Base register 35 stores the address of a base cell for $N^2$ tests. Switch 37 selects one of the addresses of a base cell and cells other than the base cell to output into address buffer 11.

In the semiconductor memory device constructed in this way, BIST circuit 23 is activated by a test enable signal and a test start signal input from an external tester respectively through a TE terminal 42 and an ENTRY terminal 43. In BIST circuit 23, loop counter 27 and program counter 29 operate in synchronization with test-clock generator 25 to provide an address to microprogram ROM 31. Then address counter 33 and data generator/comparator 39 operate in response to the output of microprogram ROM 31, so that the testing is performed. Specifically, test data generated by data generator/comparator 39 is written into memory cells 19; the data is read out from memory cells 19; and the data read out is compared with the test data by data generator/comparator 39. The comparison results are output through an ERROR terminal 44, so that the test results can be evaluated from the outside.

However, such a semiconductor memory device having a BIST circuit requires an increased amount of area within the chip, since the BIST circuit has a ROM within itself. Further, it requires a circuit for testing the ROM within the chip, so that a further increase in chip area is incurred, and manufacturing costs rise.

SUMMARY OF THE INVENTION

The present invention has been therefore devised to solve the above problems. Its object is to provide a semiconductor memory device having a BIST function and requiring a small amount of chip area.

According to a first semiconductor memory device having a test function in accordance with the present invention, in a semiconductor memory device that has memory cells which require refresh operations for retaining data and a timer which gives refresh time intervals during the refresh operations, the semiconductor memory device has a built-in self-test section comprising a test-clock generating means that generates a clock for testing during the testing of the memory cells, a sequencer means that consists in a sequential circuit that has predetermined states and outputs control signals depending on the states during the testing of the memory cells, a row address counter that generates row addresses based on the control signals during writing and reading test data, a column address counter that generates column addresses based on the control signals during writing and reading the test data, and a data generating and comparing means that generates test data based on the control signals and reads out the data written in the memory cells to compare the read data with the test data and output the comparison results. In synchronization with the clock for testing, the built-in self-test section writes the test data generated by the test data generating and comparing means into the memory cells based on the control signals and the values of the row and column address counters. The selftest section performs disturb for each cell of the memory cells, and reads out the data written in the memory cells to compare the read data with the test data to perform the self-testing of the memory cells.

According to a second semiconductor memory device having a test function in accordance with the present invention, in a semiconductor memory device that has memory cells which require refresh operations for retaining data, a timer which gives refresh time intervals during the refresh operations, and a full page counter that generates column addresses in full page mode, the semiconductor memory device being able to read and write data in synchronization with an external clock, the semiconductor memory device has a built-in self-test section comprising a test-clock generating means that generates a clock for testing during the testing of the memory cells, a sequencer means that consists in a sequential circuit that has predetermined states and outputs control signals depending on the states during the testing of the memory cells, a row address counter that generates row addresses based on the control signals during writing and reading test data, and a data generating and comparing means that generates test data based on the control signals and reads out the data written in the memory cell array to compare the read data with the test data and output the comparison results. The built-in self-test section writes the test data generated by the data generating and comparing means into the memory cells based on the control signals and the values of the full page counter and row address counters. The self-test section performs disturb for each cell of the memory cells, and reads out the data written in the memory cells to compare the read data with the test data to perform the self-testing of the memory cells.

According to a third semiconductor memory device having a test function in accordance with the present invention, in the first or second semiconductor memory device having a built-in test function, the sequencer means has a wait state before the start of testing, a write state where test data is written, a disturb state where disturb is performed, and a comparison state where the data written into the memory cells is compared with the test data. Further, the self-test section performs disturb processing that is to write into the memory cells the test data generated by the data generating and comparing means, in the write state, based on the generated row and column addresses, and to read out the data from the memory cells, in the disturb state, based on the generated row and column addresses. The self-test section then performs refresh processing that is to refresh said memory cells, based on the generated row addresses, to clarify the effects of the disturb processing. The self-test section then reads out, from the memory cells, the data written in the write state to compare the read data with the test data to perform the self-testing of the memory cells.

According to a fourth semiconductor memory device having a test function in accordance with the present invention, in the first or second semiconductor memory device having a built-in test function, the row address counter has a first row-address counter that gives row addresses during the test data writing, refresh processing, and test data comparison, and a second row-address counter that gives row addresses during the disturb processing. Further, the self-test section has a timer that gives a refresh time period during the refresh processing. By these means, $N^2$ pattern testing of the memory cells can be made possible.

According to a fifth semiconductor memory device having a test function in accordance with the present invention, in the fourth semiconductor memory device having a built-in test function, the self-test section has, in place of the timer that frequency divides the output of the timer for refresh. Using the output of the frequency divider, the self-test section gives the refresh time during the refresh processing.

According to a sixth semiconductor memory device having a test function in accordance with the present invention, in the fourth semiconductor memory device having a built-in test function, the timer varies the time intervals for output depending on predetermined address keys.

According to a seventh semiconductor memory device having a test function in accordance with the present invention, in one of the first through sixth semiconductor memory devices having a built-in test function, the data generating and comparing means has a plurality of data generating means that generate test data. The self-test section switches the patterns of test data to be output, by selecting one of the data generating means following predetermined address keys.

BRIEF DESCRIPTION OF THE DRAWINGS

These and other objects and features of the present invention will become clear from the following description taken in conjunction with the preferred embodiments thereof and the accompanying drawings throughout which like parts are designated by like reference numerals, and in which:

FIG. 2 is a diagram illustrating test patterns of row-stripes.

FIG. 9 is a diagram illustrating state transition in a main sequencer and a subsequencer.

DETAILED DESCRIPTION OF THE PREFERRED EMBODIMENTS

The preferred embodiments according to the present invention will be described below in conjunction with the attached drawings.

FIRST EMBODIMENT.

Figure 1:
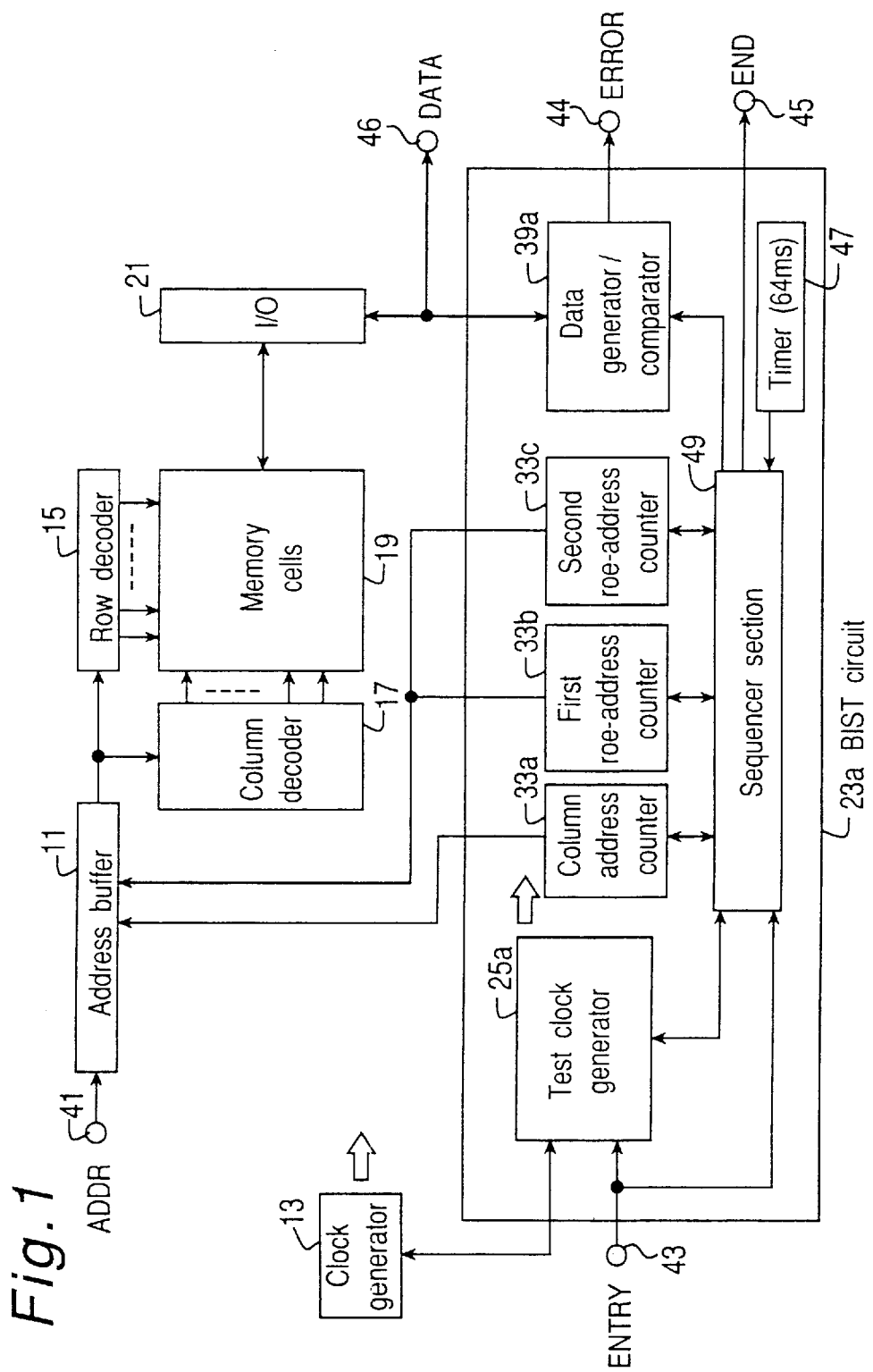
FIG. 1 is a block diagram illustrating a first embodiment of semiconductor memory devices having built-in self-test functions in accordance with the present invention.

FIG. 1 is a block diagram illustrating a first embodiment of semiconductor memory devices in accordance with the present invention. As shown in FIG. 1, the semiconductor memory device comprises a clock generator 13 that generates an internal clock, an address buffer 11 that temporarily stores the input address, a row decoder 15 that selects a word line by decoding the row address within the input address, a column decoder 17 that selects a bit line by decoding the bit address within the input address, memory cells 19 that store data, an I/O 21 that temporarily stores data to be input to and output from memory cells 19, and a BIST circuit 23a that tests memory cells 19.

Address buffer 11 is connected to an address terminal 41 and also to row decoder 15 and column decoder 17. These decoders 15 and 17 are connected to memory cells 19. Memory cells 19 are connected to I/O 21. I/O 21 is connected to data terminal 46. BIST circuit 23a is connected to address buffer 11 and I/O 21, and also to an ENTRY terminal 43, an ERROR terminal 44, and an END terminal 45. Memory cells 19 are composed of cells that require refresh operations for retaining data.

In the semiconductor memory device constructed in this way, an address is input to address buffer 11 through address terminal 41 by an external information processing apparatus and the like, when normal operations of data read are performed. This address is decoded by row decoder 15 and column decoder 17, so that a cell within memory cells 19 is specified and written out through I/O 21 and data terminal 46. Further, during data write, an address is input to address buffer 11 through address terminal 41, and data is input to I/O 21 through data terminal 46, so that data is written into memory cells 19. At this time, each block of the semiconductor memory device operates according to the internal clock generated by clock generator 13.

The semiconductor memory device of the present embodiment is connected to an external tester during testing. A test start signal is input from the external tester through ENTRY terminal 43. BIST circuit 23a operates following the test start signal and performs testing memory cells 19. BIST circuit 23a is described in the following.

As shown in FIG. 1, BIST circuit 23a comprises a test-clock generator 25a that generates a clock used within BIST circuit 23a, a column address counter 33a that generates column addresses of test data, a first row-address counter 33b and a second row-address counter 33c that generate row addresses of test data, a data generator/comparator 39a that generates test data of predetermined patterns and compares the data read out from memory cells 19 with the test data, a timer 47 that gives a predetermined time period, and a sequencer section 49 that controls the above circuits within BIST circuit 23a.

Test clock generator 25a, column address counter 33a, first row-address counter 33b, second row-address counter 33c, data generator/comparator 39a, and timer 47 are all connected to sequencer section 49. Column address counter 33a is connected to address buffer 11. First row-address counter 33b and second row-address counter 33c are connected to each other through wired OR and connected to address buffer 11. The value of either first row-address counter 33b or second row-address counter 33c is output into address buffer 11. Data generator/comparator 39a is connected to I/O 21. Further, ENTRY terminal 43 is connected to test-clock generator 25a and sequencer section 49. ERROR terminal 44 is connected to data generator/comparator 39a. END terminal 45 is connected to sequencer section 49. Test results are output through ERROR terminal 44, and a test end signal is output through END terminal 45. Further, timer 47 measures 64 ms, which is the refresh time period of memory cells, to output a timer signal every 64 milliseconds.

BIST circuit 23a starts the testing of memory cells 19, when the test start signal is input from the external tester through ENTRY terminal 43. BIST circuit 23a of the present embodiment writes into memory cells 19 the test patterns of row stripes shown in FIG. 2 to perform the $N^2$ pattern test. There are a positive pattern illustrated in FIG. 2(a) and a negative pattern illustrated in FIG. 2(b) obtained by reversing the positive pattern. BIST circuit 23a performs testing for these two patterns. The operation of BIST circuit 23a is described in the following referring to the flowcharts shown in FIGS. 3 to 6.

Figure 3:
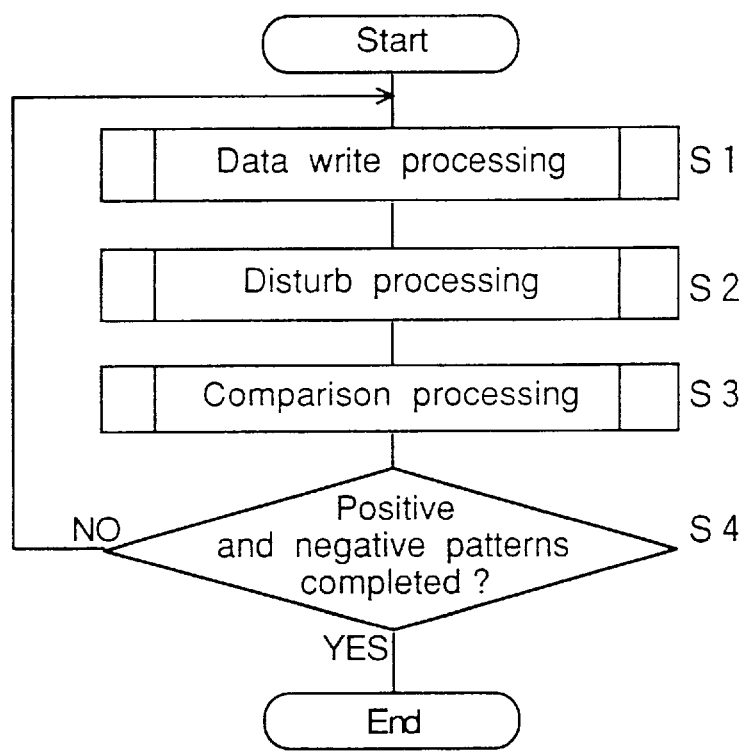
FIG. 3 is a flowchart illustrating the operation of a BIST circuit.

As shown in FIG. 3, in BIST circuit 23a, when a test start signal is input from the external tester through ENTRY terminal 43, data write processing is first performed (S1). The data write processing is the processing that writes a test pattern, a positive pattern at first, into all the bits of memory cells 19. Next, disturb processing is performed (S2). The disturb is the processing that first performs disturb for all the bits of memory cells 19 as base cells and then performs refresh operations for all the bits of memory cells 19. Next, comparison processing is performed (S3). The comparison processing is the processing that reads out data from memory cells 19 and compares the read data with the test pattern. The comparison results are output through ERROR terminal 44. Then it is judged whether the test has been performed for both the positive and negative patterns (S4). If the test for only the positive pattern has been completed, then the flow returns to step S1, and the test for the negative pattern is performed (S1 to S4). The above operations are performed with the control of each circuits of BIST circuit 23a by sequencer section 49. The details of steps S1 to S3 are described in the following.

Figure 4:
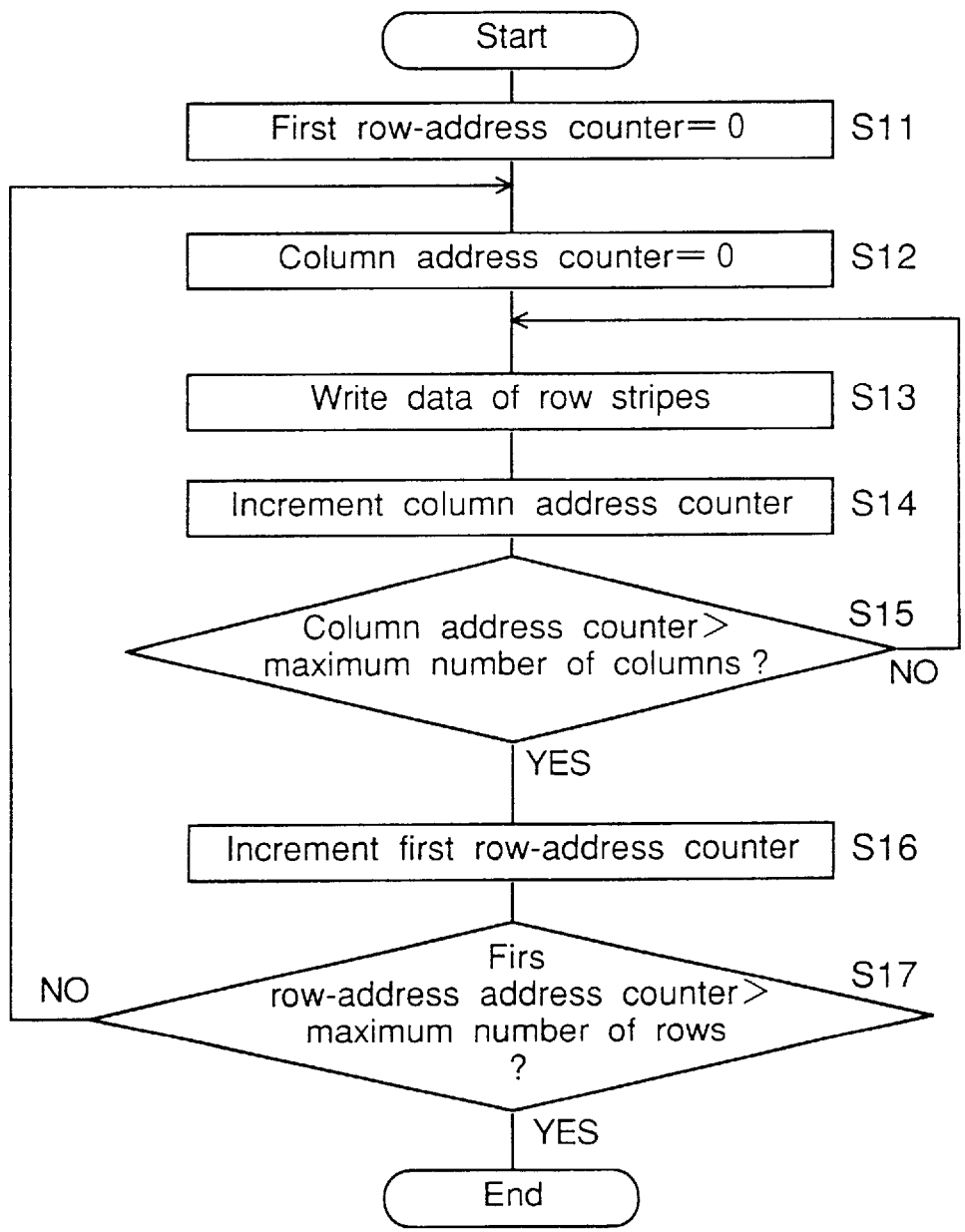
FIG. 4 is a flowchart illustrating the procedure of data write processing of step S1 in FIG. 3.

FIG. 4 shows the procedure of the data write processing of step S1 in FIG. 3. First, first row-address counter 33b is set at 0 (S1), and column address counter 33a is set at 0 (S12). Then the values of first row-address counter 33b and column address counter 33a are output into address buffer 11, and a row-stripe test pattern generated by data generator comparator 39a is output into I/O 21, so that the test data is written into memory cells 19 (S13). Then, column address counter 33a is incremented (S14). Then it is judged whether the value of column address counter 33a is within the range of the maximum column number of memory cells 19 (S15). If the value is within the range, the flow returns to step S13, so that the test data is written into the bit of the next column and the same row. If the value is outside the range, then the flow proceeds to S16. In this way, the above procedure (S13 to S15) is repeated until the test data is written into all the bits of the row specified by first row-address counter 33b. When the test data is written into all the bits of the row specified by first row-address counter 33b, first row-address counter 33b is incremented (S16). Then it is judged whether the value of first row-address counter is within the range of the maximum row number of memory cells 19 (S17). If the value is within the range, then the flow returns to step S12, so that the test data of the row stripes is written into the next row. If the value is outside the range, then the processing is terminated. In this way, the test data of the row stripes is written into all the bits of memory cells 19.

Figure 5:
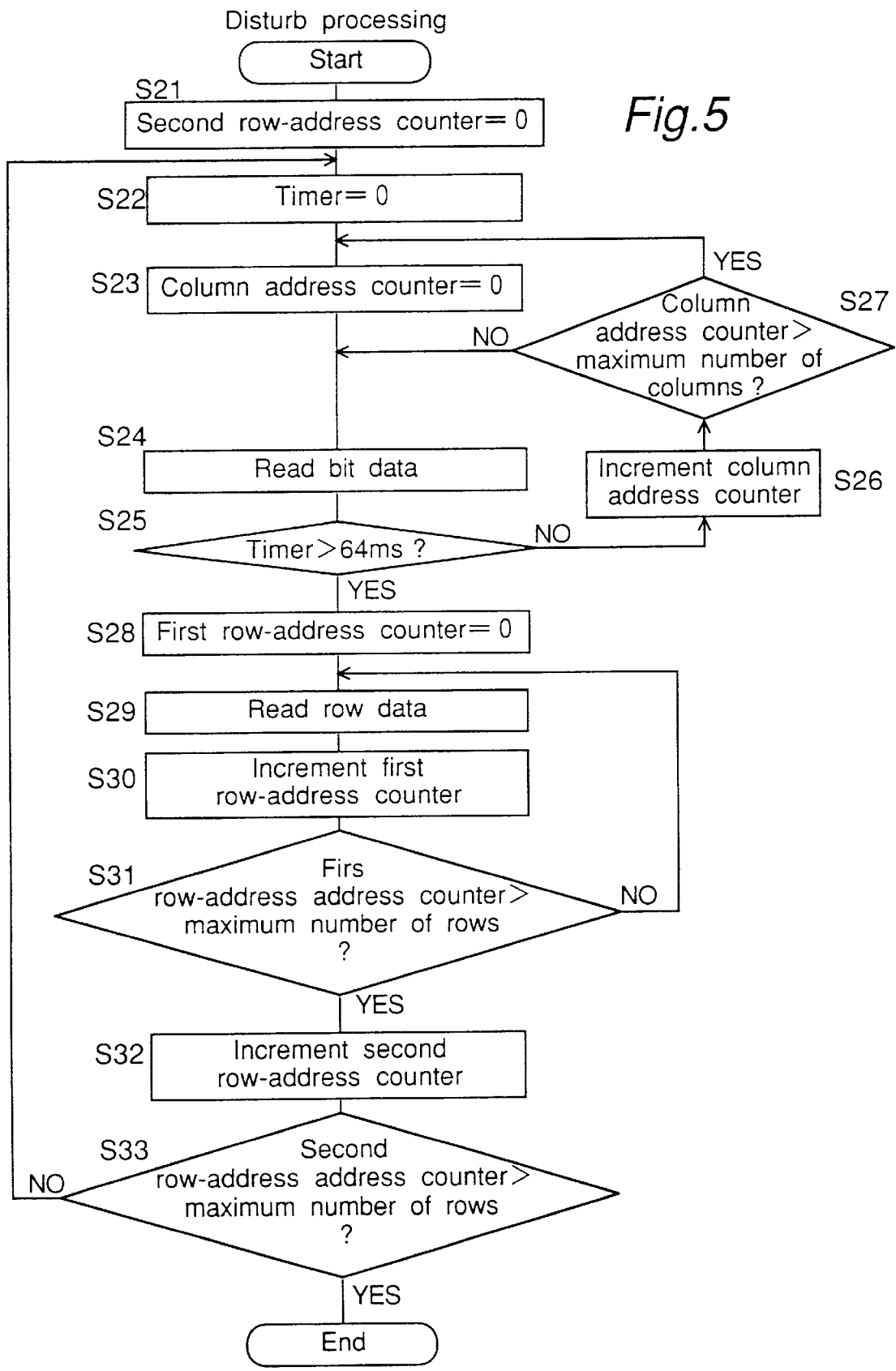
FIG. 5 is flowchart illustrating the disturb processing.

Next, the disturb processing of step S2 in FIG. 3 is described refereeing to the flowchart of FIG. 5. First, second row-address counter 33c is set at 0 (S21). Next, timer 47 is set at 0 (S22), and column address counter 33a is set at 0 (S23). The values of second row-address counter 33c and column address counter 33a are output into address buffer 11, so that the value of memory cells 19 at the address specified by the values of the address counters is read out into I/O 21 (S24). Then, based on the output of timer 47, it is judged whether 64 ms, which is the time interval for memory refresh, has passed or not after the data at the specified row address was first read out (S25). If 64 ms has not passed, then column address counter 33a is incremented (S26). Then it is judged whether the value of column address counter 33a is within the range of maximum column number (S27). If the value is out of the range, then column address counter 33a is set at 0 (S23). If the value is within the range, then the next bit data specified by the value of column address counter 33a is read out from memory cells 19 (S24). In this way, the bit data on the same row is successively read out until 64 ms passes, that is, during refresh time, so that disturb is performed. If 64 ms has passed after the test data was read out at first, the disturb for the row under current processing is completed.

Next, first row-address counter 33b is set at 0 (S28), and all the data on the row specified by first row-address counter is read out (S29). All the bits are refreshed by the read-out on the unit of one row, so that the effects of the disturb on changes in the electric potential at a bit become clear by this means. After that, first row-address counter 33b is incremented (S30). Data read-out is repeated until the data on all the rows is read out (S31), so that memory refresh is performed.

After the completion of memory refresh, second row-address counter 33c is incremented (S32), and the disturb is performed for the next row (S22 to S27). After that, refresh is performed for all the bits (S28 to S31). the above procedure is repeated, until the disturb is performed for all the rows (S33). In this way, in the disturb processing, the first row-address counter is used for giving row addresses for refresh, and the second row-address counter is used for giving row addresses for disturb.

Figure 6:
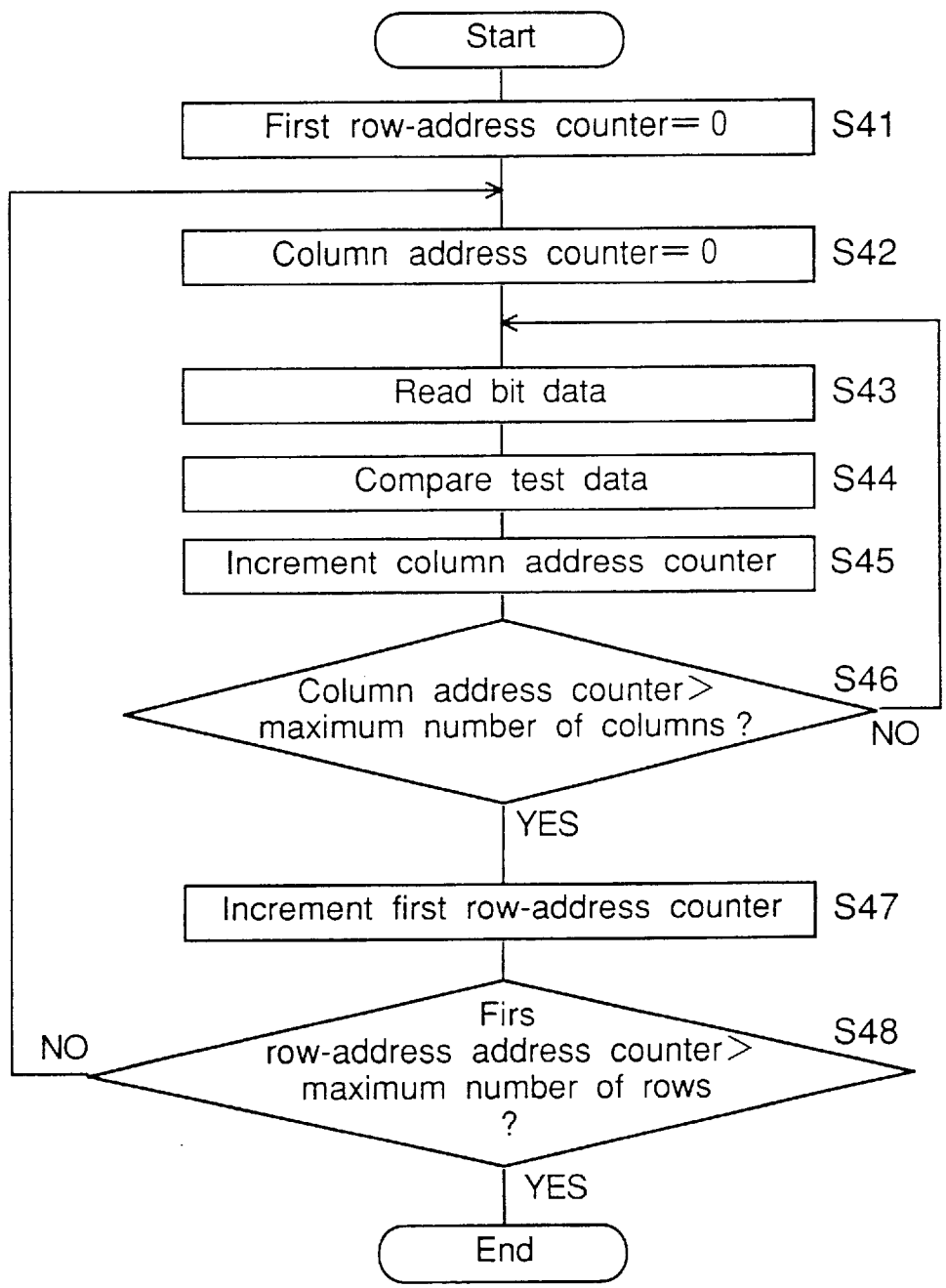
FIG. 6 is a flowchart illustrating the comparison processing.

Next, the comparison processing of step S3 in FIG. 3 is described referring to the flowchart of FIG. 6. First, first row-address counter 33b is set at 0 (S41), and column address counter 33a is set at 0 (S42). The values of these address counters are output into address buffer 11, so that the bit data of memory cells 19 specified by these values is read out into data generator/comparator 39a through I/O 21 (S43). Then the data read out from memory cells 19 and the test data are compared by data generator/comparator 39a (S44). The comparison results are output through ERROR terminal 44. Next, column address counter 33a is incremented (S45). Then, it is judged whether the value of column address counter 33a is within the range of maximum column number (S46). The above procedure is repeated (S43 to S46), until all the bits on the same row are read out and compared.

After the comparison for the data of one row is completed, first row-address counter 33b is incremented (S47) so that the flow proceeds with the next row. The above steps (S42 to S48) are repeated until the comparison for the data on all the row is completed (S48). In this way, all the data written in memory cells 19 are compared with the test data, so that evaluation of memory cells 19 is performed.

In this way, BIST circuit 23a performs the testing of memory cells 19 by performing the write processing, disturb processing, and comparison processing following the procedure shown in FIG. 3.

Figure 7:
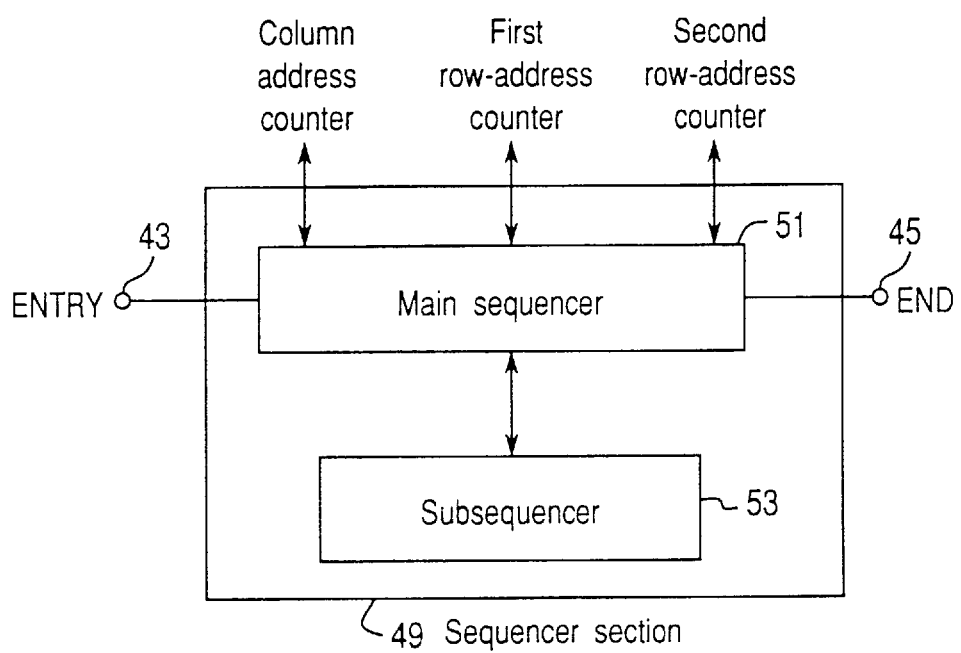
FIG. 7 is a block diagram of a sequencer section.

Next, the construction of sequencer section 49 that controls BIST circuit 23a is described. Sequencer section 49 of the present embodiment consists in a sequential circuit whose output and the next state is determined by its current state and input. Each circuit of BIST circuit 23a is controlled by sequencer section 49 so that the operation described above is performed based on the state of the sequential circuit. FIG. 7 illustrates a block diagram of sequencer section 49. As shown in FIG. 7, sequencer section 49 comprises a main sequencer 51 that controls the whole operation of sequencer section 49 and a subsequencer 53 that controls the operation during the disturb processing. These sequencers 51 and 53 are described in details in the following.

FIG. 8 is a circuitry diagram of main sequencer 51. Main sequencer 51 comprises AND gates 55 to 58, 63 to 65, JK flip-flops 60, 61, and T flip-flops 67, 68. As shown in FIG. 8(a), the output of AND gate 55 is applied to the J input of JK flip-flop 60. The Q output of JK flip-flop 60 is applied to one of the inputs of AND gate 56. The /Q output, (the complement is denoted by/hereafter) of JK flip-flop 60 is applied to one of the inputs of AND gate 57. The output of AND gate 56 is applied to the J input of JK flip-flop 61. The output of AND gate 57 is applied to the K input of JK flip-flop 61. The Q output of JK flip-flop 61 is applied to one of the inputs of AND gate 58, and the /Q output is applied one of the inputs of AND gate 55. The output of AND gate 58 is applied to the K input of JK flip-flop 60.

An ENTRY signal, which is the test start signal, is applied to another input of AND gate 55. A ROW_END signal is applied to another input of AND gate 56 and another input of AND gate 57. A DIS_END signal is applied to another input of AND gate 58.

Figure 8A:
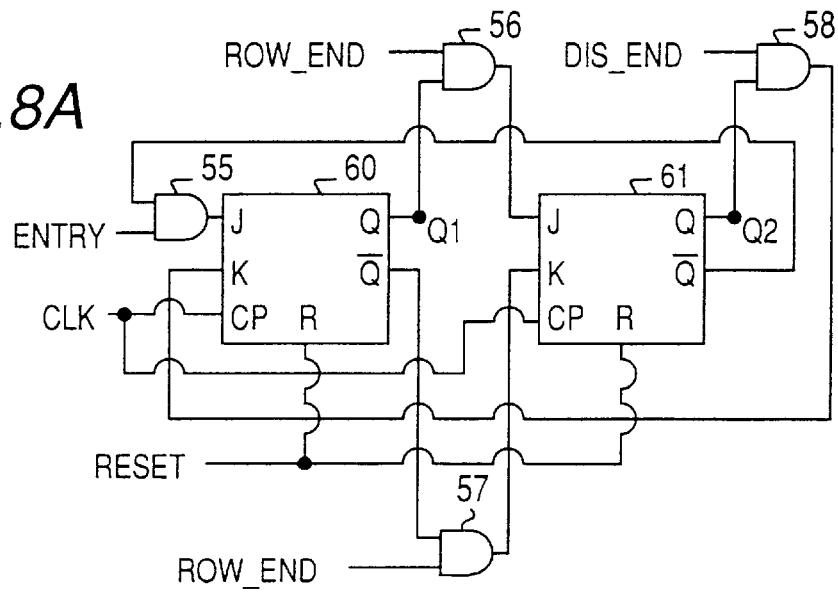
FIG. 8 is a circuitry diagram of a main sequencer.
Figure 8B:
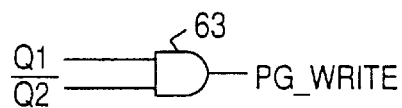
Figure 8C:
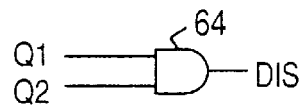
Figure 8D:
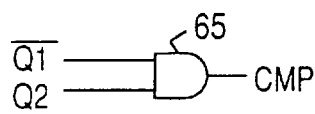
Figure 8E:
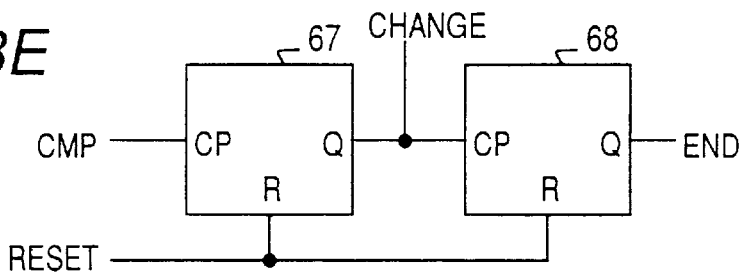

FIGS. 8(b) to 8(d) illustrate the circuits that generates the output signals that indicate the states of sequencer 51. The PG_WRITE signal, DIS signal, and CMP signal are described later. FIG. 8(e) shows the circuit that generates the END signal that is the test end signal in main sequencer 51. T flip-flops 67 and 68 are connected in serial. The generating circuit frequency divides the CMP signal with the two-stage T flip-flops 67 and 68 to generate the END signal. Further, the generating circuit taps the output of T flip-flop 67 as a CHANGE signal that selects one of the positive and negative patterns. The CHANGE signal is input to data generator/comparator 39a, so that the test patterns generated by data generator/comparator 39a are switched depending on the CHANGE signal.

FIG. 9(a) shows the state transition of sequencer 51 constructed as above. As shown in the figure, sequencer 51 has four states defined by the output signals Q1, /Q1 of JK flip-flop 60 and the output signals Q2, /Q2 of JK flip-flop 61. These four states are the wait state before the start of testing, the data write state where test data is written into memory cells 19, the disturb state where disturb and refresh are performed, and the comparison state where the data read out from memory cells 19 is compared with the test data. In the data write state, PG_WRITE signal is active. This PG_WRITE signal is obtained from the logical product of the Q1 and /Q2 signals, as shown in FIG. 8(b). In the disturb state, the DIS signal is active. The DIS signal is obtained from the logical product of the Q1 and Q2 signals, as shown in FIG. 8(c). In the comparison state, the CMP signal is active. The CMP signal is obtained from the logical product of /Q1 and Q2 signals, as shown in FIG. 8(d). Each circuit of BIST circuit 23a is controlled based on these control signals, so that the above data write processing, disturb processing, and comparison processing are performed.

Further, these four states are canceled by the state canceling signals shown in FIG. 9(a), so that the next states are attained. The ENTRY signal is a test start signal input from the external tester through ENTRY terminal 43 and cancels the wait state. The ROW_END signal is a signal for canceling the data write state and comparison state, and is output from first row-address counter 33b at the end of the test-data write processing or comparison processing. The DIS_END signal is signal for canceling the disturb state and is output from second row-address counter 33c at the end of the disturb processing.

FIG. 10 illustrates the circuitry of subsequencer 53. As shown in the figure, subsequencer 53 comprises AND gates 70 to 72, 77 to 79, and JK flip-flops 74, 75. The output of AND gate 70 is applied to the J input of JK flip-flop 74. The Q output of JK flip-flop 74 is applied to one of the inputs of AND gate 71, and the /Q output is applied to the K input of JK flip-flop 75. The output of AND gate 71 is applied to the J input of JK flip-flop 75. The Q output of JK flip-flop 75 is applied to one of the inputs of AND gate 72, and the /Q output is applied to one of the inputs of AND gate 70. The output of AND gate 72 is applied to the K input of JK flip-flop 74. FIGS. 10(b) to 10(d) illustrate the circuits that generate the output signals that indicate the states of subsequencer 53. The READ_DIS signal, REF signal, and RA_INC signals are described later.

Figure 10A:
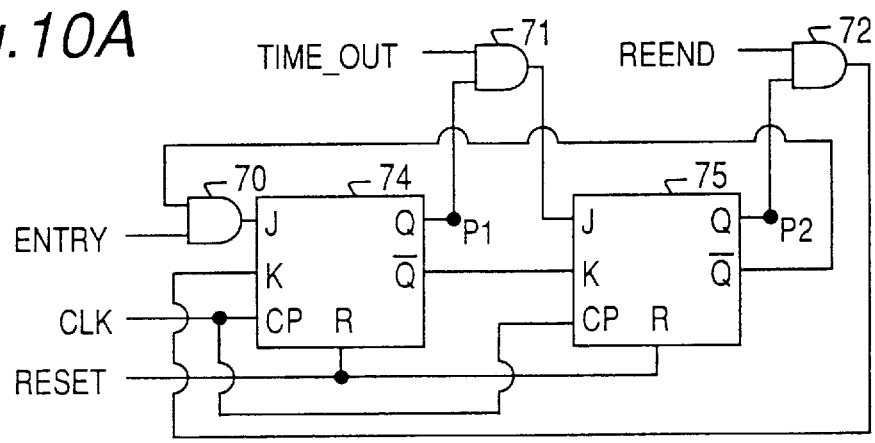
FIG. 10 is a circuitry diagram of the subsequencer.
Figure 10B:
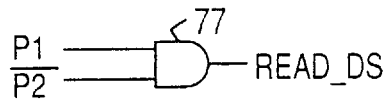
Figure 10C:
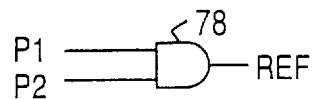
Figure 10D:
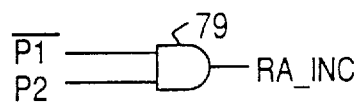

FIG. 9(b) shows the state transition of subsequencer 53. As shown in the figure, subsequencer 53 has four states defined by the output signals P1, /P1 of JK flip-flop 74 and the output signals P2, /P2 of JK flip-flop 75. These four states are the wait state before the disturb processing, the read-out disturb state where disturb is performed with read-out, the refresh state where refresh is performed, and an address increment state where the address of a row under disturb is incremented. In the read-out disturb state, the RAD_DIS signal is active. The READ_DIS signal is obtained from the logical product of the P1 and /P2 signals, as shown in FIG. 10(b). In the refresh state, the REF signal is active. The REF signal is obtained from the logical product of the P1 and P2 signals, as shown in FIG. 10(c). In the address increment state, the RA_INC signal is active. The RA_INC signal is obtained form the logical product of the /P1 and P2 signals. Each circuit within BIST circuit 23a is controlled based on these signals, so that the disturb processing is performed.

Further, these four states are canceled by the state canceling signals described in the following, so that the next states are attained. The DIS signal is a signal for starting the disturb processing and is output from main sequencer 51. The DIS signal cancels the wait state. The TIME_OUT signal is signal for canceling the read-out disturb state and is output from timer 47 when refresh time passes. The REF_END signal is a signal for canceling the refresh state and is output from second row-address counter 33c at the end of the refresh processing.

Figure 11:
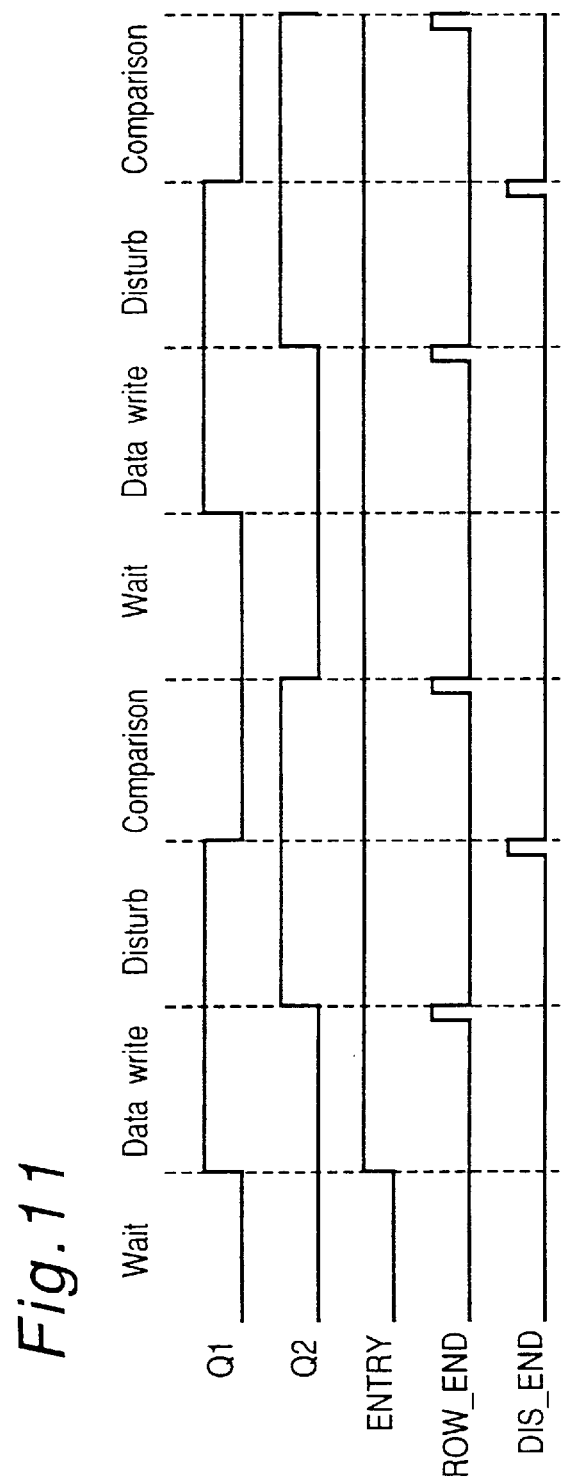
FIG. 11 is a timing chart of the main sequencer.

FIG. 11 shows a timing chart of sequencer 51. As shown in the figure, when the ENTRY signal is made active by the external tester, Q1 becomes 1, and the state of main sequencer 51 changes from the wait state into the data write state. At this time, the PG_WRITE signal becomes active, and the data write processing described above is performed based on this signal, so that test data is written into memory cells 19. When the writing of the test data is completed, first row-address counter 33b makes the ROW_END signal active. At this time, the DIS signal becomes active, and the disturb processing is performed based on this signal, so that the disturb through data write and the refresh are performed. The disturb processing at this time is controlled by subsequencer 53. the control of subsequencer 53 is described later. When the disturb processing is completed, and second row-address counter 33c makes the DIS_END signal active, the state of main sequencer 51 changes from the disturb state into the comparison state. At this time, the CMP signal becomes active, and the comparison signal is performed based on this signal, so that data is read out from memory cells 19 and compared with the test data. Further, when the CMP signal becomes active for the first time, the CHANGE signal is made active by the circuit shown in FIG. 8(e), so that the test patterns generated by data generator/comparator 39a are switched. When the comparison processing ends, first row-address counter 33b outputs the ROW_END signal, so that the state returns from the comparison state to the wait state. The ENTRY signal remains active at this time, so that the second write processing, disturb processing, and comparison processing are performed for the second time. When the CMP signal becomes active for the second time, the END signal is made active by the circuit shown in FIG. 8(e), so that the completion of the test is informed to the external tester through END terminal 45.

Figure 12:
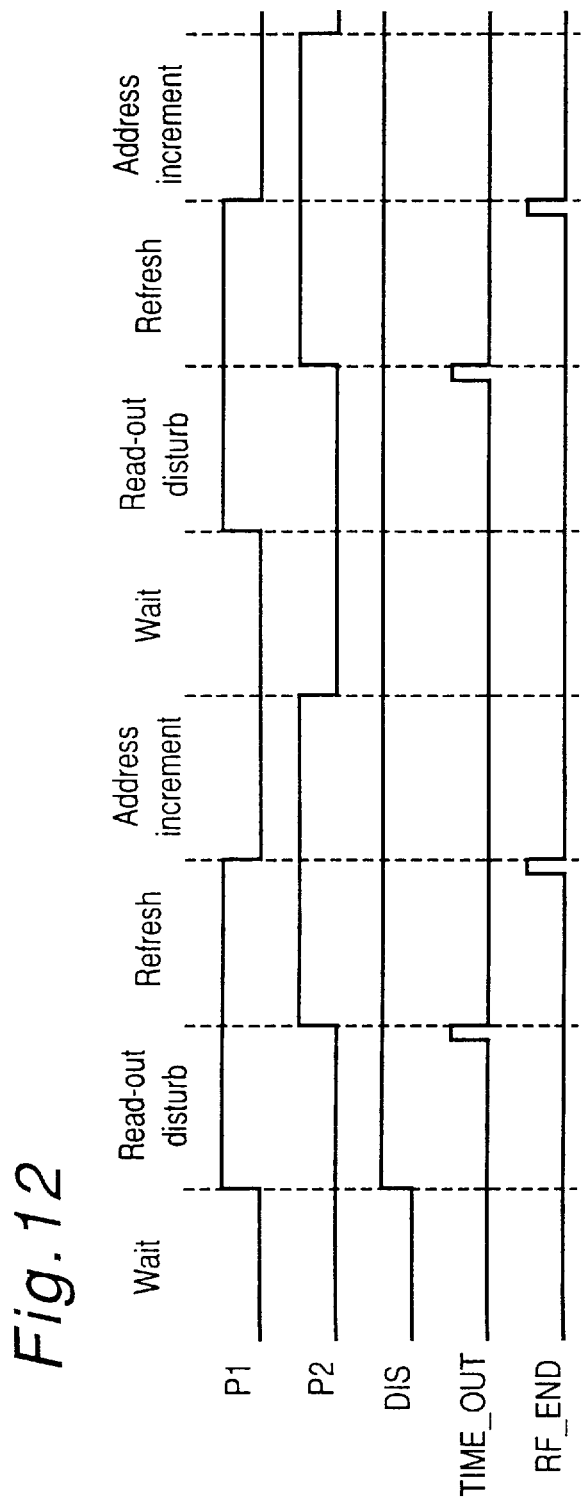
FIG. 12 is a timing chart of the subsequencer.

FIG. 12 shows a timing chart of sequencer 53. In the figure, when main sequencer 51 is in the disturb state, the DIS signal becomes active, so that the state of subsequencer 53 changes from the wait state to the read-out disturb state. At this time, the READ_DIS signal becomes active, and each circuit of BIST circuit 23a is controlled based on this signal, and disturb is performed. When the refresh time passes, timer 47 makes the TIME_OUT signal active, so that the state of subsequencer 53 changes from the read-out disturb state to the refresh state. At this time, the REF signal becomes active, and each circuit of BIST circuit 23a is controlled based on this signal, and refresh is performed. When the refresh ends, second row-address counter 33c makes RF_END signal active, so that the state changes from the refresh state into the address increment state. In the address increment state, the RA_INC signal becomes active. The address in second row-address counter 33c is incremented, and the state changes into the wait state. The above sequence of states is repeated until the read-out disturb processing for all the rows is performed.

As described above, the states of main sequencer 51 and subsequencer 53 within sequencer 49 change, so that each circuit within BIST circuit 23a is controlled based on the states, and memory cells 19 are tested.

Figure 13:
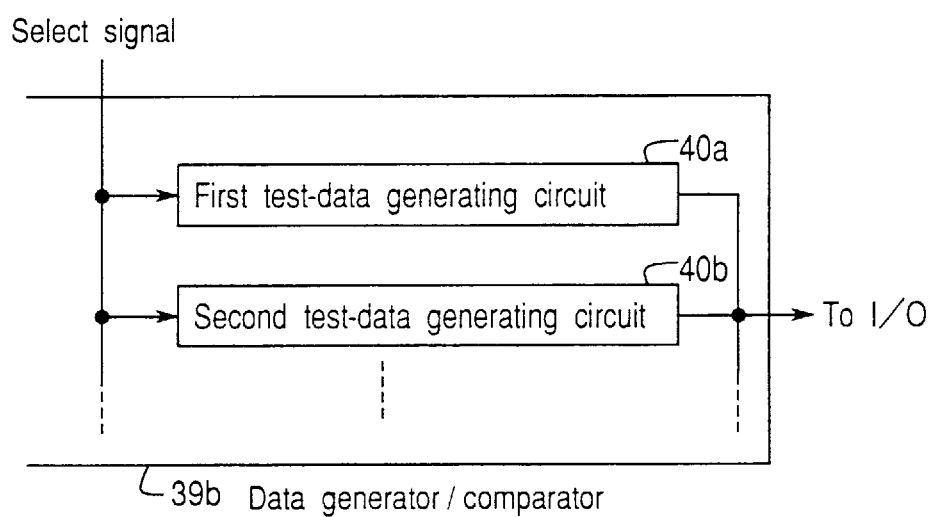
FIG. 13 is a circuitry diagram of a data generator/comparator that generates a plurality of test patterns.

A semiconductor memory device such as DRAM usually has a function of becoming a test mode when predetermined signals are input in a predetermined order. When, in the test mode, a special address, called address key, is given, the semiconductor memory device performs specific processing depending on the address key. Therefore, the setting in BIST circuit 23a may be altered using the address key. For example, a plurality of address keys are determined beforehand. BIST circuit 23a may be activated with a certain address key. Thereafter, the refresh time for timer 47 may switched between 64 ms and 128 ms with some other address keys. Further, as shown in FIG. 13, data generator/comparator 39b may be composed from test-data generating circuits 40a, 40b that generate a plurality of different test patterns such as row stripes and cell checkers. Then the test patterns output from data generator/comparator 39b may be switched by selecting one of test-data generating circuits 40a, 40b.

As described above, in the semiconductor memory device of the present embodiment, the sequencer section installed within the BIST circuit controls each circuit within the BIST circuit following a predetermined procedure so that processing such as the generation of test patterns, data writing, disturb processing, and comparison of data is performed to test the memory cells. Therefore, the BIST circuit can be realized by a simple construction. Therefore, a semiconductor memory device having built-in self-test circuits can be made within a chip of small area.

SECOND EMBODIMENT.

Figure 14:
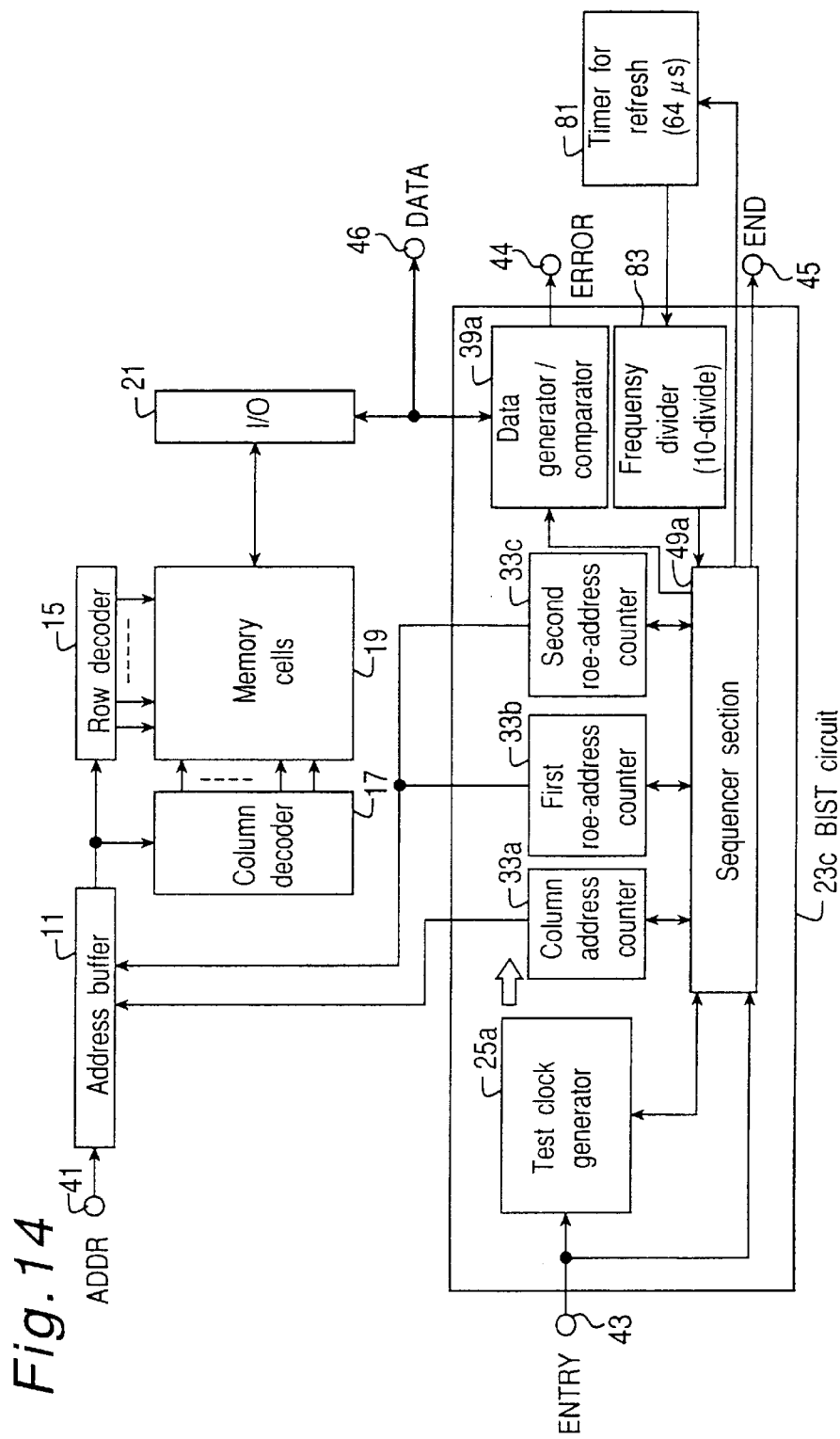
FIG. 14 is a block diagram illustrating a second embodiment of semiconductor memory devices having built-in self-test functions in accordance with the present invention.

FIG. 14 a block diagram of the BIST circuit in a second embodiment of the present embodiment. In the semiconductor memory device of the present embodiment, a frequency divider 83 is installed in place of timer 47 in BIST circuit 23a of the first embodiment. A semiconductor memory device that requires refresh operations for retaining memory contents, such as DRAM, usually has a timer 81 for refresh operations. The present embodiment uses the timer 81 in place of the timer 47 of the first embodiment by frequency dividing the output signal of timer 81 with frequency divider 83. For example, if timer 81 outputs a timer signal every 64 μs, the signal from timer 81 is 10-frequency divided, so that a timer signal of 64 ms is obtained. Therefore, the timing of the start of refresh in the disturb processing can be obtained within the BIST circuit 23c as in the first embodiment. Since frequency divider 83 can be constructed with circuitry simpler that timer 47, the circuitry of the BIST circuit becomes simpler than in the first embodiment, so that further deduction of chip area occupied by the BIST circuit can be obtained.

THIRD EMBODIMENT.

Figure 15:
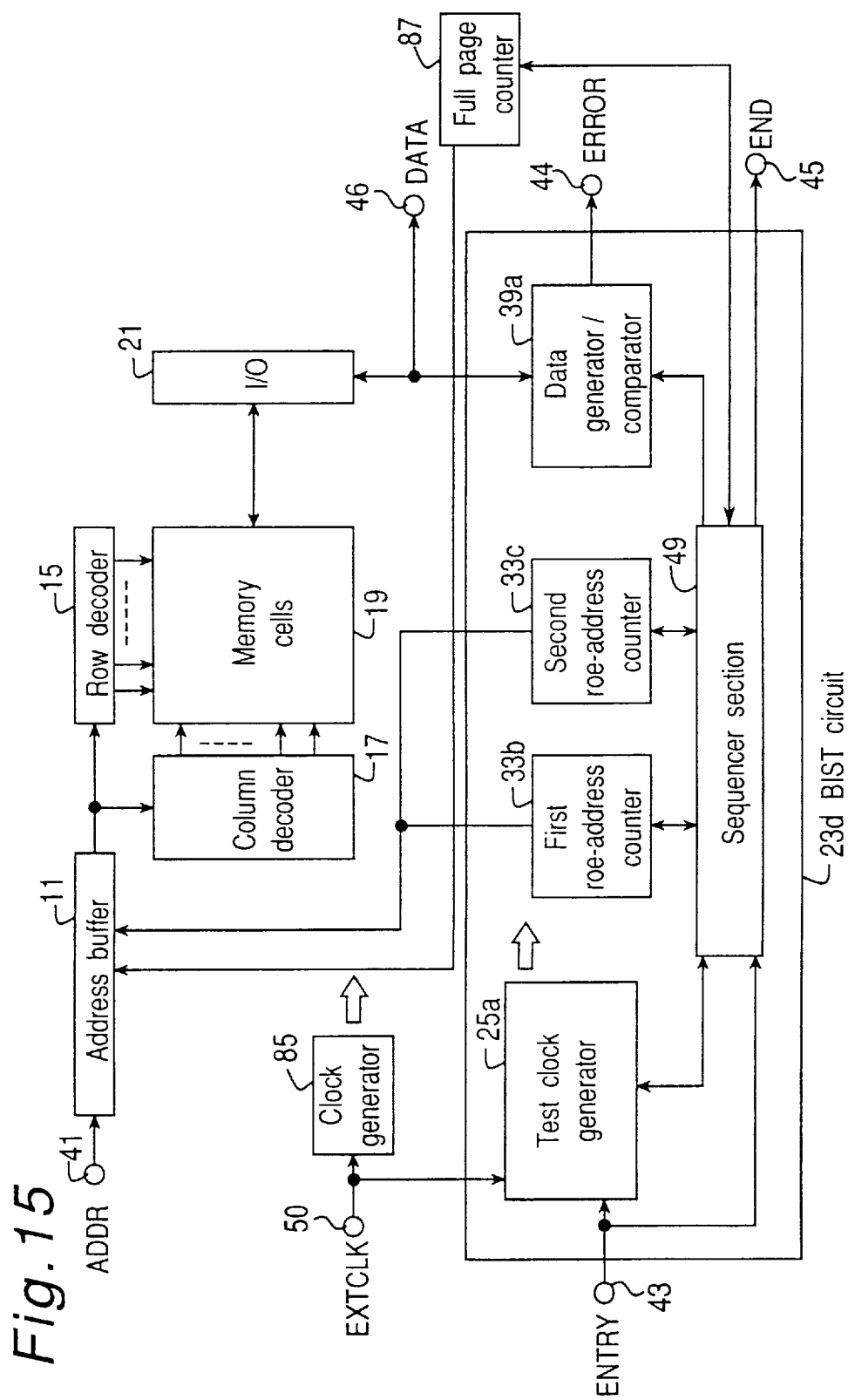
FIG. 15 is a block diagram illustrating a third embodiment of semiconductor memory devices having built-in self-test functions in accordance with the present invention.
Figure 16:
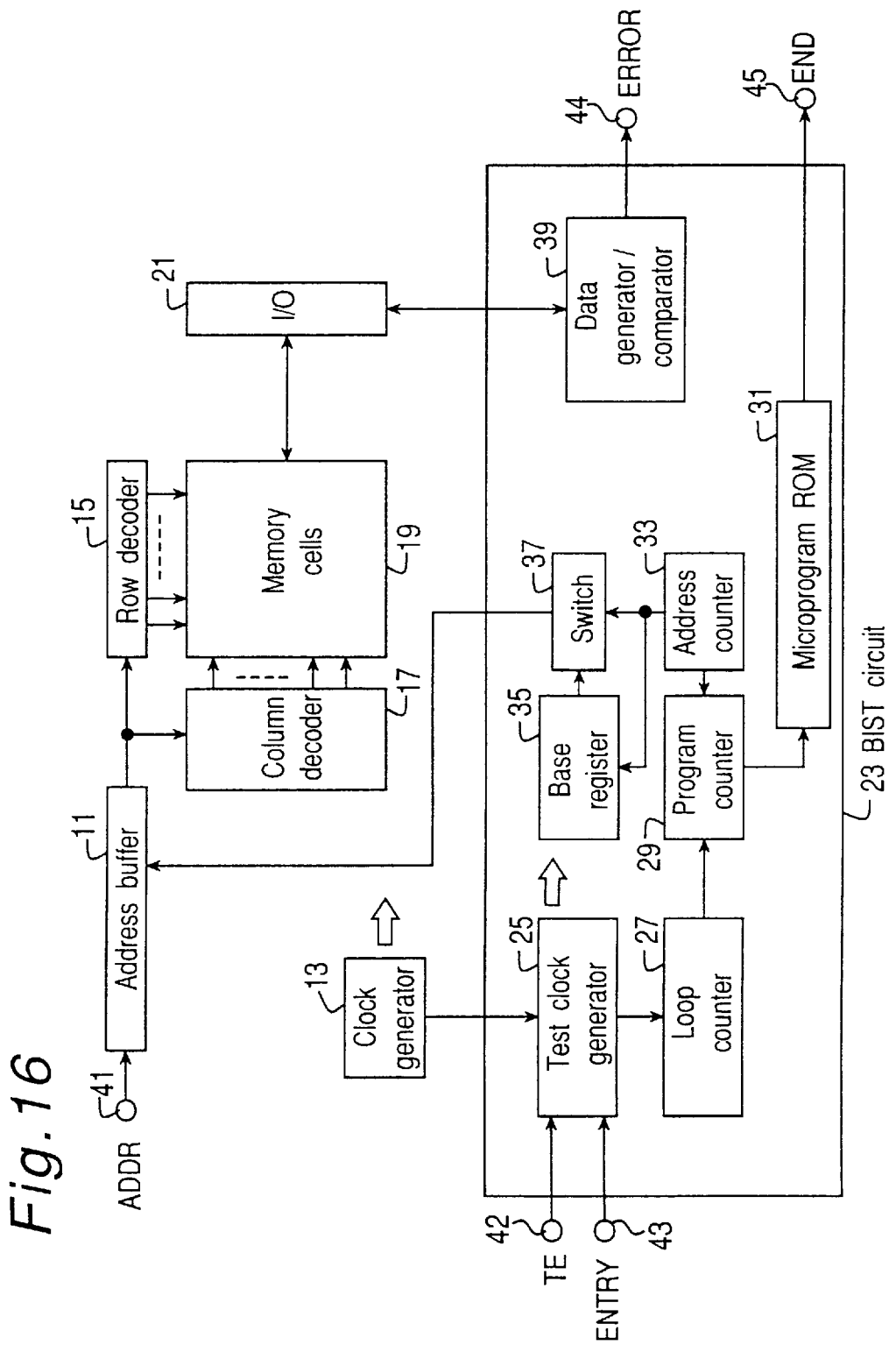
FIG. 16 is block diagram illustrating a prior semiconductor memory device having a built-in self-test function.

FIG. 15 is a block diagram of the BIST circuit in a third embodiment of the present invention. In the third embodiment, the semiconductor memory device is a synchronous DRAM or Rambus DRAM that operates at high speed in synchronization with an external clock. As shown in the figure, a synchronous DRAM and the like have an external clock terminal 50, so that a clock generator 85 generates a clock in synchronization with an external clock input through external clock terminal 50. Further, a synchronous DRAM and the like have usually a full page counter 87 that gives column addresses when it operates in the full page mode. The BIST circuit in the present embodiment gives column addresses during memory testing, using full page counter 87 in place of column address counter 33a of BIST circuit 23a in the first embodiment. Therefore, a BIST circuit 23d of the present embodiment lacks the column address counter 33a of the first embodiment. Sequencer 49a controls full page counter 87 and the other circuits within BIST circuit 23d, based on the clock signal for testing generated by test clock generator 25a in synchronization with the external clock, to perform memory testing.

In this way, the present embodiment uses a full page counter used in a synchronous DRAM and the like as a column address counter, so that a column address counter installed within the BIST circuit becomes unnecessary. Therefore, the circuitry becomes simpler and further reduction of chip area occupied by the BIST circuit can be obtained.

According to a first semiconductor memory device having a test function in accordance with the present invention, in the built-in self-test section that performs memory testing, the sequencer means that controls the operation of the built-in self-test section is constructed as a sequential circuit. Therefore, a built-in self-test can be realized with simple circuitry, and the chip area of the semiconductor memory device having self-test functions can be reduced.

According to a second semiconductor memory device having a test function in accordance with the present invention, in a semiconductor memory device that operates in synchronization with an external clock, the sequencer that controls the operation of the built-in self-test section is constructed as a sequential circuit, and the column addresses of the data is given during the test using a full page counter in stalled in the semiconductor memory and operating in synchronization with an external clock. Therefore, a column address counter for giving column addresses becomes unnecessary within the built-in self-test section. Therefore, a built-in self-test can be realized with simple circuitry, and the chip area of the semiconductor memory device having self-test functions can be reduced.

According to a third semiconductor memory device having a test function in accordance with the present invention, the sequencer means has a wait state before the start of testing, a write state where test data is written, a disturb state where disturb is performed, and a comparison state where the data written into the memory cells is compared with the test data. The operation of the built-in self-test section is controlled based on these states. The built-in self-test is performed by the sequencer means, so that a built-in self-test can be realized with simple circuitry, and the chip area of the semiconductor memory device having self-test functions can be reduced.

According to a fourth semiconductor memory device having a test function in accordance with the present invention, the built-in self-test section has a first row-address counter, a second row-address counter, and a timer that gives refresh time during the refresh processing, The built-in self-test section can perform $N^2$ pattern testing by these means.

According to a fifth semiconductor memory device having a test function in accordance with the present invention, the self-test section has, in place of the timer, a frequency divider that frequency divides the output of the timer for refresh. Therefore, a built-in self-test can be realized with a simpler circuitry than in the fourth semiconductor memory device, so that further deduction of chip area in a semiconductor memory device having built-in self-test functions can be realized.

According to a sixth semiconductor memory device having a test function in accordance with the present invention, the timer varies the time intervals for output depending on predetermined address keys. Therefore, the switching of refresh time becomes easy during refresh.

According to a seventh semiconductor memory device having a test function in accordance with the present invention, the self-test section switches the patterns of test data to be output based on predetermined address keys. Therefore, the switching of the output patterns of test data becomes easy.

What is claimed is:

1. A semiconductor memory device with a built-in self-test circuit that has memory cells which require refresh operations for retaining data and a timer which gives refresh time intervals during said refresh operations, said built-in self-test circuit of said semiconductor memory device comprising:

a test-clock generating means that generates a clock for testing during the test of said memory cells, a sequencer means that consists of a sequential circuit having a plurality of predetermined states and outputs control signals corresponding to said plurality of predetermined states during the test of said memory cells, a row address counter that generates row addresses based on said control signals during writing and reading test data, a column address counter that generates column addresses based on said control signals during writing and reading the test data, a data generating and comparing means that generates test data based on said control signals and reads out the data written in said memory cells to compare the read data with said test data and output the comparison results; and wherein said built-in self-test circuit writes said test data generated by said test data generating and comparing means into said memory cells, in synchronization with the clock for testing, based on said control signals and the values of said row and column address counters, performs disturb for each cell of said memory cells, and reads out the data written in said memory cells to compare the read data with said test data to perform the self-test of said memory cells.

2. The semiconductor memory device as defined in claim 1 in which said sequencer means has a wait state before the start of testing, a write state where test data is written, a disturb state where disturb is performed, and a comparison state where the data written into said memory cells is compared with said test data; and in which said built-in self-test section performs steps of:

performing disturb processing that is to write into said memory cells said test data generated by said data generating and comparing means, in said write state, based on the generated row and column addresses, and to read out the data from said memory cells, in said disturb state, based on the generated row and column addresses, performing refresh processing that is to refresh the memory cells, based on the generated row addresses, to clarify the effects of the disturb processing, and reading out, from said memory cells, the data written in said write state to compare the read data with said test data to perform self-testing of said memory cells.

3. The semiconductor memory device as defined in claim 2 in which said row address counter comprises:

a first row-address counter that gives row addresses during the test data writing, said refresh processing, and the test data comparison; and a second row-address counter that gives row addresses during said disturb processing; and said self-test circuit provides with a timer that gives a refresh time period during said refresh processing to allow $N^2$ pattern tests of said memory cells.

4. The semiconductor memory device as defined in claim 3 in which said self-test circuit has, in place of said timer, a frequency divider that frequency divides the output of said timer for refresh.

5. The semiconductor memory device as defined in claim 3 in which said timer varies the time intervals for output depending on predetermined address keys.

6. The semiconductor memory device as defined in claim 1 in which said data generating and comparing means has a plurality of data generating means that generate a plurality of patterns of test data, and said self-test circuit switches the patterns of the test data to be output, by selecting one of said data generating means following predetermined address keys.

7. A semiconductor memory device with a built-in self-test circuit that has memory cells which require refresh operations for retaining data, a timer which gives refresh time intervals during said refresh operations, and a full page counter that generates column addresses in full page mode, said semiconductor memory device being able to read and write data in synchronization with an external clock, said built-in self-test circuit of said semiconductor memory device comprising:

a test-clock generating means that generates a clock for testing during the test of said memory cells, a sequencer means that consists in a sequential circuit that has predetermined states and outputs control signals depending on said states during the test of said memory cells, a row address counter that generates row addresses based on said control signals during writing and reading test data, and a data generating and comparing means that generates test data based on said control signals and reads out the data written in the memory cell array to compare the read data with said test data and output the comparison results;

wherein said built-in self-test circuit:

writes said test data generated by said data generating and comparing means into said memory cells, based on said control signals and the values of said full page counter and column address counters, performs disturb for each cell of said memory cells, and reads out the data written in said memory cells to compare the read data with said test data to perform the self-test of said memory cells.

8. The semiconductor memory device as defined in claim 7 in which said sequencer means has a wait state before the start of testing, a write state where test data is written, a disturb state where disturb is performed, and a comparison state where the data written into said memory cells is compared with said test data; and in which said built-in self-test section performs steps of:

performing disturb processing that is to write into said memory cells said test data generated by said data generating and comparing means, in said write state, based on the generated row and column addresses, and to read out the data from said memory cells, in said disturb state, based on the generated row and column addresses, performing refresh processing that is to refresh the memory cells, based on the generated row addresses, to clarify the effects of the disturb processing, and reading out, from said memory cells, the data written in said write state to compare the read data with said test data to perform self-testing of said memory cells.

9. The semiconductor memory device as defined in claim 8 in which said row address counter comprises:

a first row-address counter that gives row addresses during the test data writing, said refresh processing, and the test data comparison; and a second row-address counter that gives row addresses during said disturb processing; and said self-test circuit provides with a timer that gives a refresh time period during said refresh processing to allow $N_2$ pattern tests of said memory cells.

10. The semiconductor memory device as defined in claim 8 in which said self-test circuit has, in place of said timer, a frequency divider that frequency divides the output of said timer for refresh.

11. The semiconductor memory device as defined in claim 8 in which said timer varies the time intervals for output depending on predetermined address keys.

12. The semiconductor memory device as defined in claim 7 in which said data generating and comparing means has a plurality of data generating means that generate a plurality of patterns of test data, and said self-test section switches the patterns of the test data to be output, by selecting one of said data generating means following predetermined address keys.

* * * * *